United States Patent
Beck et al.

(10) Patent No.: US 7,972,553 B2
(45) Date of Patent: *Jul. 5, 2011

(54) METHOD FOR IMPRINT LITHOGRAPHY AT CONSTANT TEMPERATURE

(75) Inventors: Marc Beck, Lund (SE); Babak Heidari, Furulund (SE); Erik Bolmsjö, Malmö (SE); Erik Theander, Lund (SE)

(73) Assignee: Obducat AB, Malmo (SE)

( * ) Notice: Subject to any disclaimer, the term of this patent is extended or adjusted under 35 U.S.C. 154(b) by 650 days.

This patent is subject to a terminal disclaimer.

(21) Appl. No.: 11/579,540

(22) PCT Filed: Nov. 25, 2004

(86) PCT No.: PCT/EP2004/053106
§ 371 (c)(1),
(2), (4) Date: Nov. 3, 2006

(87) PCT Pub. No.: WO2005/109095
PCT Pub. Date: Nov. 17, 2005

(65) Prior Publication Data
US 2007/0164487 A1     Jul. 19, 2007

Related U.S. Application Data

(60) Provisional application No. 60/521,562, filed on May 25, 2004.

(30) Foreign Application Priority Data

May 7, 2004   (EP) ..................... 04445057

(51) Int. Cl.
*B29C 35/02*    (2006.01)
*B29C 35/08*    (2006.01)

(52) U.S. Cl. ......... 264/402; 264/405; 264/494; 264/496
(58) Field of Classification Search .......... 264/401–406, 264/494, 496
See application file for complete search history.

(56) References Cited

U.S. PATENT DOCUMENTS
4,233,261 A    11/1980   Mijnheer
(Continued)

FOREIGN PATENT DOCUMENTS
CN    1478642 A    3/2004
(Continued)

OTHER PUBLICATIONS

Pfeiffer et al., Multistep profiles by mix and match of nanoimprint and UV lithography, Microelectric Engineering, vol. 57-58 (2001), pp. 381-387.*

(Continued)

*Primary Examiner* — Kat Wyrozebski
*Assistant Examiner* — Scott W Dodds
(74) *Attorney, Agent, or Firm* — Renner, Otto, Boisselle & Sklar, LLP

(57) ABSTRACT

Method for transferring a pattern from a template (10) having a structured surface (11) to a substrate (12) carrying a surface layer (14) of a material devised to 5 solidify upon exposure to radiation, comprising: arranging said template and substrate mutually parallel in an imprint apparatus, with said structured surface facing said surface layer; heating the template and the substrate to a temperature $T_p$ by means of a heater device (20); and while maintaining said temperature $T_p$, performing the steps of: pressing the template towards the substrate for imprinting said pattern into said layer; exposing said layer to radiation (19) for solidifying the layer, and—postbaking the layer.

23 Claims, 7 Drawing Sheets

U.S. PATENT DOCUMENTS

| | | | |
|---|---|---|---|
| 4,312,823 A | | 1/1982 | Kraakman et al. |
| 4,360,266 A | | 11/1982 | Takeuchi |
| 4,844,947 A | * | 7/1989 | Kasner et al. .................. 427/510 |
| 5,804,017 A | | 9/1998 | Hector |
| 5,866,281 A | * | 2/1999 | Guckel et al. .................... 430/22 |
| 5,947,027 A | * | 9/1999 | Burgin et al. .................. 101/474 |
| 6,027,630 A | * | 2/2000 | Cohen ............................ 205/135 |
| 6,190,929 B1 | | 2/2001 | Wang et al. |
| 6,284,345 B1 | * | 9/2001 | Ruoff ............................. 428/143 |
| 6,334,960 B1 | * | 1/2002 | Willson et al. .................. 216/52 |
| 6,387,787 B1 | | 5/2002 | Mancini et al. |
| 6,482,742 B1 | | 11/2002 | Chou |
| 6,743,740 B2 | | 6/2004 | Brask |
| 6,949,199 B1 | | 9/2005 | Gauzner et al. |
| 7,144,539 B2 | * | 12/2006 | Olsson ........................... 264/293 |
| 7,374,864 B2 | * | 5/2008 | Guo et al. ...................... 430/302 |
| 2003/0071016 A1 | * | 4/2003 | Shih et al. ........................ 216/54 |
| 2003/0159608 A1 | | 8/2003 | Heidari |
| 2003/0189273 A1 | | 10/2003 | Olsson |
| 2004/0021254 A1 | * | 2/2004 | Sreenivasan et al. ......... 264/406 |
| 2004/0079730 A1 | * | 4/2004 | Ahrens et al. .................... 216/87 |
| 2004/0110856 A1 | * | 6/2004 | Young et al. ....................... 522/6 |
| 2004/0131718 A1 | | 7/2004 | Chou et al. |
| 2005/0158419 A1 | | 7/2005 | Watts et al. |
| 2005/0202350 A1 | | 9/2005 | Colburn et al. |

FOREIGN PATENT DOCUMENTS

| | | |
|---|---|---|
| DE | 36 43817 | 6/1988 |
| JP | 2-289311 | 11/1990 |
| JP | 02289311 | 11/1990 |
| JP | 11191240 | 7/1999 |
| JP | 2000-194142 | 7/2000 |
| JP | 2003-77867 | 3/2003 |
| JP | 2003-077867 | 3/2003 |
| JP | 2003-516644 | 5/2003 |
| JP | 2003-272998 | 9/2003 |
| WO | WO 01/33300 A2 | 5/2001 |
| WO | WO 01/42858 A1 | 6/2001 |
| WO | 02/07199 | 1/2002 |
| WO | WO 02/07199 A1 | 1/2002 |
| WO | WO 02/067055 | 8/2002 |
| WO | WO 03/005124 | 1/2003 |
| WO | 03/073164 | 9/2003 |

OTHER PUBLICATIONS

Resnick D. J. et al., "Imprint Lithography for Integrated Circuit Fabrication", Journal of Vaccum Science & Technology, American Vacuum Society, vol. 21, No. 6, pp. 2624-2631, (2003).

Wissen et al., "UV Curing of Resists for Warm Embossing", Elsevier B.V., Microelectronic Engineering, vol. 73-74, pp. 184-187, (2004).

Reano et al., "Stability of Functional Polymers After Plasticizer-Assisted Imprint Lithography", Journal of Vaccum Science & Technology, American Vacuum Society, vol. 22, No. 6, pp. 3294-3299, (2004).

Bender et al., "Fabrication of Nanostructures Using a UV-Based Imprint Technique", Elsevier B.V., Microelectronic Engineering, vol. 53, pp. 233-236, (2000).

Heidari et al.; "Large Scale Nanolithography Using Nanoimprint Lithography"; Journal of Vacuum Science & Technology B, vol. 17, No. 6, pp. 2961-2964, (1999).

English language version of "Notification of the First Office Action" in corresponding Chinese App. No. 200510081756.4, Notification Date Jun. 6, 2008.

English language version of "Notification of the Second Office Action" in corresponding Chinese App. No. 200510081756.4, Notification Date Oct. 7, 2009.

Office Action in U.S. Appl. No. 10/581,497, Date Nov. 25, 2009 (16 pages).

Office Action in U.S. Appl. No. 11/123,087, Date Feb. 3, 2009 (11 pages).

Office Action in U.S. Appl. No. 11/123,087, Date Jun. 27, 2008 (8 pages).

Office Action in U.S. Appl. No. 11/123,087, Date Oct. 10, 2007 (9 pages).

Office Action in U.S. Appl. No. 11/905,036, Date Jun. 9, 2009 (13 pages).

Office Action in corresponding U.S. Appl. No. 11/905,036 mailed Dec. 29, 2009 (16 pages).

Office Action in corresponding U.S. Appl. No. 10/581,497 mailed May 4, 2010 (17 pages).

Official Action from corresponding European Application No. 04 445 057.5 dated Oct. 25, 2010.

Office Action in corresponding Japanese Patent Application No. 2005-136511 mailed Jul. 30, 2010 and English translation.

Office Action in corresponding U.S. Appl. No. 10/581,497 mailed Mar. 24, 2011 (14 pages).

* cited by examiner

METHOD FOR IMPRINT LITHOGRAPHY AT CONSTANT TEMPERATURE

CROSS REFERENCE TO RELATED APPLICATIONS

This application is a national phase application based on PCT/EP2004/053106, filed Nov. 25, 2004, and claims the priority of European Patent Application No. 04445057.5, filed on May 7, 2004, and the benefit of U.S. Provisional Application No. 60/521,562, filed on May 25, 2004, the contents of which all of which are incorporated herein by reference.

FIELD OF THE INVENTION

The invention relates to a method for imprint lithography of structures on a micro or nanometre scale. In particular, the invention relates to constant temperature imprint lithography at constant temperature for improved accuracy.

BACKGROUND

The trend in microelectronics, as well as in micromechanics, is towards ever smaller dimensions. Some of the most interesting techniques for fabrication of micro and submicro structures include different types of lithography.

Photolithography typically involves the steps of coating a substrate with a photoresist material to form a resist layer on a surface of the substrate. The resist layer is then exposed to radiation at selective portions, preferably by using a mask. Subsequent developing steps remove portions of the resist, thereby forming a pattern in the resist corresponding to the mask. The removal of resist portions exposes the substrate surface, which may be processed by e.g. etching, doping, or metallization. For fine scale replication, photolithography is limited by diffraction, which is dependent on the wavelength of the radiation used. For fabrication of structures on a scale of less than 50 nm, such a short wavelength is needed that the material requirements on the optical systems will be major.

An alternative technique is imprint technology. In an imprint lithography process, a substrate to be patterned is covered by a mouldable layer. A pattern to be transferred to the substrate is predefined in three dimensions on a stamp or template. The template is brought into contact with the mouldable layer, and the layer is softened, preferably by heating. The template is then pressed into the softened layer, thereby making an imprint of the template pattern in the mouldable layer. The layer is cooled down until it hardens to a satisfactory degree followed by detachment and removal of the template. Subsequent etching may be employed to replicate the template pattern in the substrate. The steps of heating and cooling the combined template and substrate can bring about movement in the engaging surfaces due to heat expansion. The larger the area to be imprinted, the larger the actual expansion and contraction, which can make the imprint process more difficult for larger surface areas.

A different form of imprint technology, generally known as step and flash imprint lithography has been proposed by Willson et al. in U.S. Pat. No. 6,334,960, and also by Mancini et al in U.S. Pat. No. 6,387,787. Similar to the imprint technique briefly described above, this technique involves a template having a structured surface defining a pattern to be transferred to a substrate. The substrate is covered by a layer of polymerisable fluid, a pre-polymer, into which layer the template is pressed such that the fluid fills recesses in the pattern structure. The template is made from a material which is transparent to a radiation wavelength range which is usable for polymerising the polymerisable fluid, typically UV light. By applying radiation to the fluid through the template, the fluid is solidified. The template is subsequently removed, after which the pattern thereof is replicated in the solid polymer material layer made from the polymerised fluid. Further processing transfers the structure in the solid polymer material layer to the substrate.

WO 02/067055 to Board of Regents, the University of Texas System, discloses a system for applying step and flash imprint lithography. Among other things, this document relates to production-scale implementation of a step and flash apparatus, also called a stepper. The template used in such an apparatus has a rigid body of transparent material, typically quartz. The template is supported in the stepper by flexure members, which allow the template to pivot about both X and Y axes, which are mutually perpendicular in a plane parallel to the substrate surface to be imprinted. This mechanism also involves a piezo actuator for controlling parallelism and the gap between the template and the substrate. Such a system is, however, not capable of handling large area substrate surfaces in a single imprint step. A step and flash system offered on the market is the IMPRIO 100, provided by Molecular Imprints, Inc, 1807-C West Braker Lane, Austin, Tex. 78758, U.S.A. This system has a template image area of 25×25 mm, and a street width of 0.1 mm. Although this system is capable of handling substrate wafers of up to 8 inches, the imprint process has to be repeated by lifting the template, moving it sideways, and lowering it to the substrate again, by means of an X-Y translation stage. Furthermore, for each such step, renewed alignment as well as new dispensation of polymerisable fluid has to be performed. This technique is therefore very time-consuming, and less than optimum for large scale production. Furthermore, besides problems of repeated alignment errors, and high accuracy demands on the translation stage, this technique suffers from the drawback that continuous structures which are larger than said template size cannot be produced. All in all, this means the productions costs may be too high to make this technique interesting for large scale production of fine structure devices.

Another drawback with the state of the art technology for UV-assisted imprint, is that in many cases it is desirable to use non-transparent templates. Nickel is typically used as a template material, for its excellent material properties. However, a nickel template is of course not transparent, wherefore UV radiation has to be supplied through the substrate. In such a case, a substrate of e.g. glass or quartz, or a suitable plastic material may be used. Furthermore, using different materials in the template and the substrate generally means that they have different coefficients of thermal expansion. This, in turn, may cause problems during steps of heating and cooling, limiting the accuracy of the process.

SUMMARY OF THE INVENTION

Accordingly, an object of the present invention is to provide methods and means for improving fabrication of structures comprising three-dimensional features on a micro or nanometre scale. Aspects of this object involve providing an improved method for transferring a pattern to a substrate with improved accuracy, a method involving a simplified production process, and a method making it possible to imprint large continuous structures on substrates having widths of more than one inch, and even for 8 inch diameters, 12 inch diameters, and larger.

According to the invention, this object is fulfilled by a method for transferring a pattern from a template having a structured surface to a substrate carrying a surface layer of a material devised to solidify upon exposure to radiation, comprising:

arranging said template and substrate mutually parallel in an imprint apparatus, with said structured surface facing said surface layer;

heating the template and the substrate to a temperature $T_p$ by means of a heater device; and while maintaining said temperature $T_p$, performing the steps of:

pressing the template towards the substrate for imprinting said pattern into said layer;

exposing said layer to radiation for solidifying the layer, and postbaking the layer.

In one embodiment, said material is a crosslinkable thermoplastic polymer having a glass temperature $T_g$, and wherein $T_p$ exceeds $T_g$.

In one embodiment, said material is a UV-crosslinkable thermoplastic polymer having a glass temperature $T_g$, wherein temperature $T_p$ exceeds temperature $T_g$, and wherein said radiation is UV radiation.

In one embodiment, said material is photo chemically amplified.

In one embodiment, the method comprises:
applying said surface layer on the substrate by spin-coating said material, prior to the step of arranging said template and substrate mutually parallel.

In one embodiment, said material is a UV-curable thermoplastic pre-polymer, and wherein said radiation is UV radiation.

In one embodiment, the method comprises:
arranging the template and the substrate sandwiched between a stop member and a first side of a flexible membrane, and wherein
the pressing of the template towards the substrate involves applying an overpressure to a medium present on a second side of the membrane.

In one embodiment, said medium comprises a gas.
In one embodiment, said medium comprises air.
In one embodiment, said medium comprises a liquid.
In one embodiment, said medium comprises a gel.
In one embodiment, the method comprises:
emitting radiation to said layer through said template, which template is transparent to a wavelength range of a radiation usable for solidifying said material; and
heating said substrate by direct contact with said heater device.

In one embodiment, the method comprises:
emitting radiation to said layer through said substrate, which substrate is transparent to a wavelength range of a radiation usable for solidifying said material; and
heating said template by direct contact with said heater device.

In one embodiment, the method comprises:
emitting radiation to said layer through said membrane, which membrane is transparent to a wavelength range of a radiation usable for solidifying said material.

In one embodiment, the method comprises:
emitting radiation to said layer through said membrane, and through a transparent wall opposing said membrane, defining a back wall for a cavity for said medium, which back wall and membrane are transparent to a wavelength range of a radiation usable for solidifying said material.

In one embodiment, the step of exposing said layer comprises:
emitting radiation from a radiation source within a wavelength range of 100-500 nm.

In one embodiment, the method comprises:
emitting pulsating radiation with a pulse duration in the range of 0.5-10 μs and a pulse rate in the range of 1-10 pulses per second.

In one embodiment, the method comprises:
clamping said substrate and template together prior to arranging said template and substrate between said stop member and said flexible membrane.

In one embodiment, the method comprises:
applying a vacuum between said template and said substrate in order to extract air inclusions from said surface layer prior to exposing said layer to radiation.

In one embodiment, said structured surface includes protrusions defining a pattern, which protrusions are non-transparent to said radiation, whereby the step of exposing said layer to radiation involves solidifying said layer at portions between said protrusions.

In one embodiment, said protrusions include a layer of a non-transparent material.

In one embodiment, a layer of a non-transparent material is applied as an outermost layer on said protrusions.

In one embodiment, the temperature $T_p$ is within the range of 50-250° C.

BRIEF DESCRIPTION OF THE DRAWINGS

The invention will be described in greater detail below with reference to the accompanying drawings, on which.

DETAILED DESCRIPTION OF PREFERRED EMBODIMENTS

The present invention relates, in general, to a method of transferring a pattern from a template to a substrate, by creating a relief image of a structure on a surface of the template on a surface of the substrate. The surface of the template and the surface of the substrate are in this process arranged generally parallel to each other, and the transfer of the pattern is obtained by pressing the structured template surface into a formable layer disposed on the substrate surface. The formable layer is treated to solidify, such that its shape is forced to resemble the template surface. The template can thereafter be removed from the substrate and its layer, said layer now being an inverted topographical replica of the template. In order to permanent the transferred pattern in the substrate, further processing may be required. Typically, wet or dry etching is performed to selectively etch the surface of the substrate under the solidified layer, whereby the pattern in the solidified layer is transferred to the substrate surface. This much is state of the art, and is well described in prior art documents, such as the aforementioned U.S. Pat. No. 6,334,960.

Figure 1:
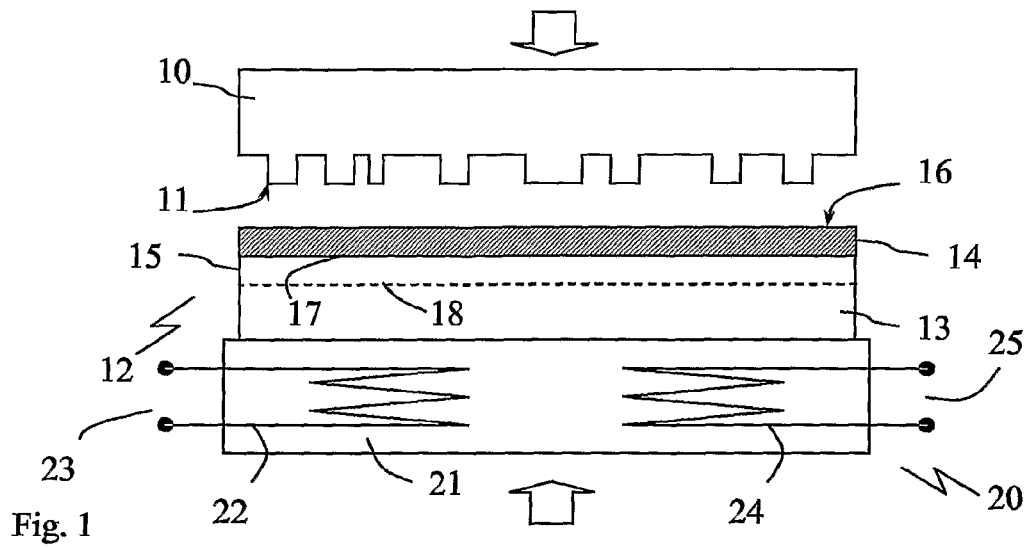
FIGS. 1-3 schematically illustrate the main process steps for transferring a pattern from a template to a substrate, wherein radiation is applied through a transparent template to solidify a polymerisable fluid on the substrate surface.
Figure 2:
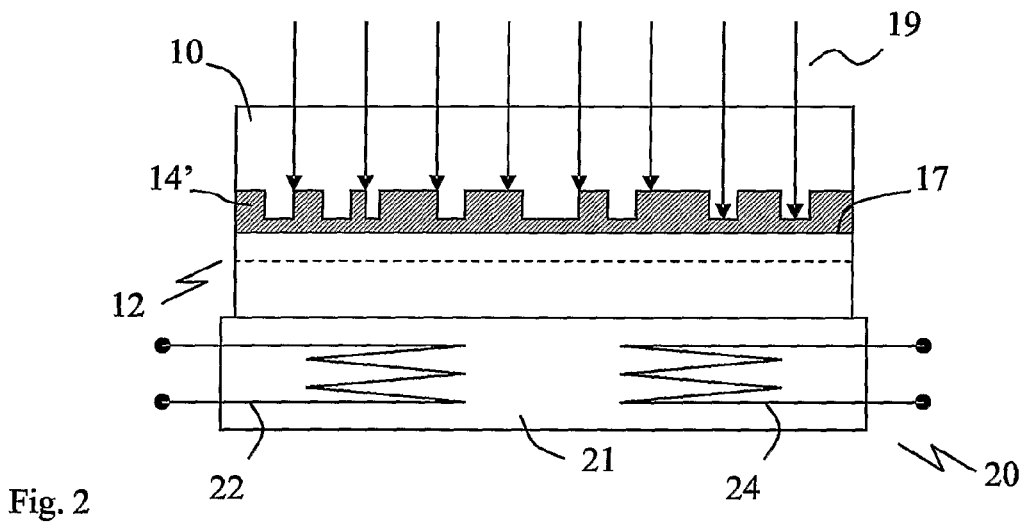
Figure 3:
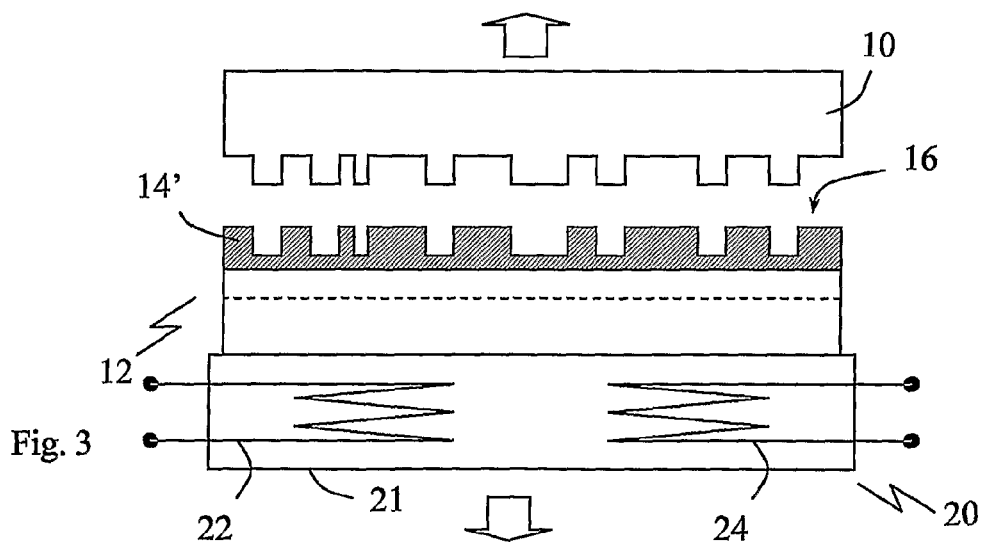

FIGS. 1-3 schematically present the basic process steps of the actual pattern transfer steps, or imprint steps, of an embodiment of the invention.

In FIG. 1 a template 10 is illustrated, the template having a structured surface 11, in which three-dimensional protrusions and recesses are formed with a feature size in height and width within a range of 1 nm to several μm, and potentially both smaller and larger. The thickness of template 10 is typically between 10 and 1000 μm. A substrate 12 has a surface 17 which is arranged substantially parallel to template surface 11, with an intermediate spacing between the surfaces at the initial stage shown in FIG. 1. The substrate 12 comprises a substrate base 13, to which the pattern of template surface 11 is to be transferred. Though not shown, the substrate may also include a support layer below the substrate base 13. In a process where the pattern of template 10 is to be transferred to substrate 12 directly through an imprint in a polymer material, said material may be applied as a surface layer 14 directly onto the substrate base surface 17. In alternative embodiments, indicated by the dashed line, a transfer layer 15 is also employed, of e.g. a second polymer material. Examples of such transfer layers, and how they are used in the subsequent process of transferring the imprinted pattern to the substrate base 13, are also described in U.S. Pat. No. 6,334,960. In an embodiment including a transfer layer 15, substrate surface 17 denotes the upper or outer surface of the transfer layer 15, which in turn is arranged on the substrate base surface 18.

Substrate 12 is positioned on a heater device 20. Heater device 20 preferably comprises a heater body 21 of metal, e.g. aluminium. A heater element 22 is connected to or included in heater body 21, for transferring thermal energy to heater body 21. In one embodiment, heater element 22 is an electrical immersion heater inserted in a socket in heater body 21. In another embodiment, an electrical heating coil is provided inside heater body 21, or attached to a lower surface of heater body 21. In yet another embodiment, heating element 22 is a formed channel in heater body 21, for passing a heating fluid through said channel. Heater element 22 is further provided with connectors 23 for connection to an external energy source (not shown). In the case of electrical heating, connectors 23 are preferably galvanic contacts for connection to a current source. For an embodiment with formed channels for passing a heating fluid, said connectors 23 are preferably conduits for attachment to a heated fluid source. The heating fluid may e.g. be water, or an oil. Yet another option is to employ an IR radiation heater as a heater element 22, devised to emit infrared radiation onto heater body 21. Furthermore, a temperature controller is included in heater device 20 (not shown), comprising means for heating heater element 22 to a selected temperature and maintaining that temperature within a certain temperature tolerance. Different types of temperature controllers a well known within the art, and are therefore not discussed in further detail.

Heater body 21 is preferably a piece of cast metal, such as aluminium, stainless steel, or other metal. Furthermore, a body 21 of a certain mass and thickness is preferably used such that an even distribution of heat at an upper side of heater device 20 is achieved, which upper side is connected to substrate 12 for transferring heat from body 21 through substrate 12 to heat layer 14. For an imprint process used to imprint 2.5" substrates, a heater body 21 of at least 2.5" diameter, and preferably 3" or more, is used, with a thickness of at least 1 cm, preferably at least 2 or 3 cm. For an imprint process used to imprint 6" substrates, a heater body 21 of at least 6" diameter, and preferably 7" or more, is used, with a thickness of at least 2 cm, preferably at least 3 or 4 cm. Heater device 20 is preferably capable of heating heater body 21 to a temperature of up to 200-300° C., though lower temperatures will be sufficient for most processes.

For the purpose of providing controlled cooling of layer 14, heater device 20 may further be provided with a cooling element 24 connected to or included in heater body 21, for transferring thermal energy from heater body 21. In a preferred embodiment, cooling element 24 comprises a formed channel or channels in heater body 21, for passing a cooling fluid through said channel or channels. Cooling element 24 is further provided with connectors 25 for connection to an external cooling source (not shown). Preferably, said connectors 25 are conduits for attachment to a cooling fluid source. Said cooling fluid is preferably water, but may alternatively be an oil, e.g. an insulating oil.

A preferred embodiment of the invention makes use of a radiation-crosslinkable thermoplastic polymer solution material for layer 14, which preferably is spin-coatable. These polymer solutions may also be photo chemically amplified. An examples of such a material is mr-L6000.1 XP from Micro Resist Technology, which is UV-crosslinkable. Other examples of such radiation-crosslinkable materials are negative photoresist materials like Shipley ma-N 1400, SC100, and MicroChem SU-8. A material which is spin-coatable is advantageous, since it allows complete and accurate coating of en entire substrate.

Another embodiment makes use of a liquid or near liquid pre-polymer material for layer 14, which is polymerisable by means of radiation. Examples of available and usable polymerisable materials for layer 14 comprise NIP-K17, NIP-K22, and NIP-K28 from ZEN Photonics, 104-11 Moonji-Dong, Yusong-Gu, Daejeon 305-308, South Korea. NIP-K17 has a main component of acrylate, and has a viscosity at 25° C. of about 9.63 cps. NIP-K22 also has a main component of acrylate, and a viscosity at 25° C. of about 5.85 cps. These substances are devised to cure under exposure to ultraviolet radiation above 12 mW/cm$^2$ for 2 minutes.

Another example of an available and usable polymerisable material for layer 14 is Ormocore from Micro Resist Technology GmbH, Koopenicker Strasse 325, Haus 211, D-12555 Berlin, Germany. This substance has a composition of inorganic-organic hybrid polymer, unsaturated, with a 1-3% photopolymerisation initiator. The viscosity of 3-8 mPas at 25° C. is fairly high, and the fluid may be cured under exposure of radiation with 500 mJ/cm$^2$ at a wavelength of 365 nm. Other usable materials are mentioned in U.S. Pat. No. 6,334,960.

Common for all these materials, and any other material usable for carrying out the invention, is that they have the capability to solidify when exposed to radiation, particularly UV radiation, e.g. by cross-linking of polymer solution materials or curing of pre-polymers. Herein, such materials used for layer 14 are commonly called radiation polymerisable.

The thickness of layer 14 when deposited on the substrate surface is typically 10 nm-10 μm, depending on application area. The polymerisable material is preferably applied in liquid form onto substrate 12, preferably by spin coating, or optionally by roller coating, dip coating or similar. One advantage with the present invention compared to the prior art step and flash method, typically when using a cross-linkable polymer material, is that the polymer material may be spin coated on the entire substrate, which is an advantageous and fast process offering excellent layer evenness. Cross-linkable materials, such as those mentioned, are typically solid in normal room temperature, and a substrate which has been pre-coated at an elevated temperature may therefore conveniently be used. The step and flash method, on the other hand, has to use repeated dispensation by dripping on repeated surface portions, since that method is incapable of handling large surfaces in single steps. This makes both the step and flash process and the machine for carrying out such a process complex and hard to control.

A preferred embodiment of the method according to the invention will now be described with reference to FIGS. 1-3. According to the invention, the process steps of imprinting; solidifying the imprint layer material by radiation, and postbaking the material, are performed at a constant temperature.

The arrows of FIG. 1 illustrate that the template surface 11 is pressed into surface 16 of the polymerisable material layer 14. At this step, heater device 20 is preferably used to control the temperature of layer 14, for obtaining a suitable viscosity in the material of layer 14. For a crosslinkable material of layer 14, heater device 20 is therefore controlled to heat layer 14 to a temperature $T_p$ exceeding the glass temperature $T_g$ of the material of layer 14. In this context, $T_p$ stands for process temperature, indicating that it is one temperature level common for the process steps of imprint, exposure, and postbaking. The level of constant temperature $T_p$ is of course dependent on the type of material chosen for layer 14, since it must exceed the glass transition temperature $T_g$ for the case of a cross-linkable material and also be suitable for postbaking the radiation-cured material of the layer. For radiation-crosslinkable materials $T_p$ typically ranges within 50-250° C. For the example of mr-L6000.1 XP, successful tests have been performed with a constant temperature throughout imprint, exposure and postbake of 100-120° C. For embodiments using radiation-curable pre-polymers, such materials are typically liquid or near liquid in room temperature, and therefore need little or no heating to become soft enough for imprinting. However, also these materials must generally go through post-baking for complete hardening after exposure, prior to separation from the template. The process temperature $T_p$ is therefore set to a suitable post-baking temperature level already in the imprint step beginning at the step of FIG. 1.

FIG. 2 illustrates how the structures of template surface 11 has made an imprint in the material layer 14, which is in fluid or at least soft form, at which the fluid has been forced to fill the recesses in template surface 11. In the illustrated embodiment, the highest protrusions in template surface 11 do not penetrate all the way down to substrate surface 17. This may be beneficial for protecting the substrate surface 17, and particularly the template surface 11, from damage. However, in alternative embodiments, such as one including a transfer layer, imprint may be performed all the way down to transfer layer surface 17. In the embodiment illustrated in FIGS. 1-3, the template is made from a material which is transparent to radiation 19 of a predetermined wavelength or wavelength range, which is usable for solidifying a selected polymerisable material. Such materials may e.g. be quartz or various forms of polymers, dependent on the radiation wavelength. Since the template generally is extremely thin, typically less than a millimetre, also glass templates may be used even if a UV-sensitive material is used in layer 14, since there will be very little absorption in the template material. Radiation 19 is typically applied when template 10 has been pressed into layer 14 with a suitable alignment between template 10 and substrate 12. When exposed to this radiation 19, solidification of the polymerisable material is initiated, for solidification to a solid body 14' taking the shape determined by the template 10. During the step of exposing layer 14 to radiation, heater 20 is controlled to maintain the temperature of layer 14 at temperature $T_p$.

After exposure to radiation, a postbaking step is performed, to completely harden the material of layer 14'. In this step, heater device 20 is used to provide heat to layer 14', for baking layer 14' to a hardened body before separation of template 10 and substrate 12. Furthermore, postbaking is performed by maintaining the aforementioned temperature $T_p$. This way, template 10 and material layer 14, 14' will maintain the same temperature from the beginning of solidification of material 14 by exposure to radiation, to finalized postbaking, and optionally also through separation of template 10 and substrate 12. This way, accuracy limitations due to differences in thermal expansion in any of the materials used for the substrate and the template are eliminated.

The template 10 is e.g. removed by a peeling and pulling process. The formed and solidified polymer layer 14' remains on the substrate 12. The various different ways of further processing of the substrate and its layer 14' will not be dealt with here in any detail, since the invention as such is neither related to such further processing, nor is it dependent on how such further processing is achieved. Generally speaking, further processing for transferring the pattern of template 10 to the substrate base 13 may e.g. include etching or plating followed by a lift-off step.

Figure 4:
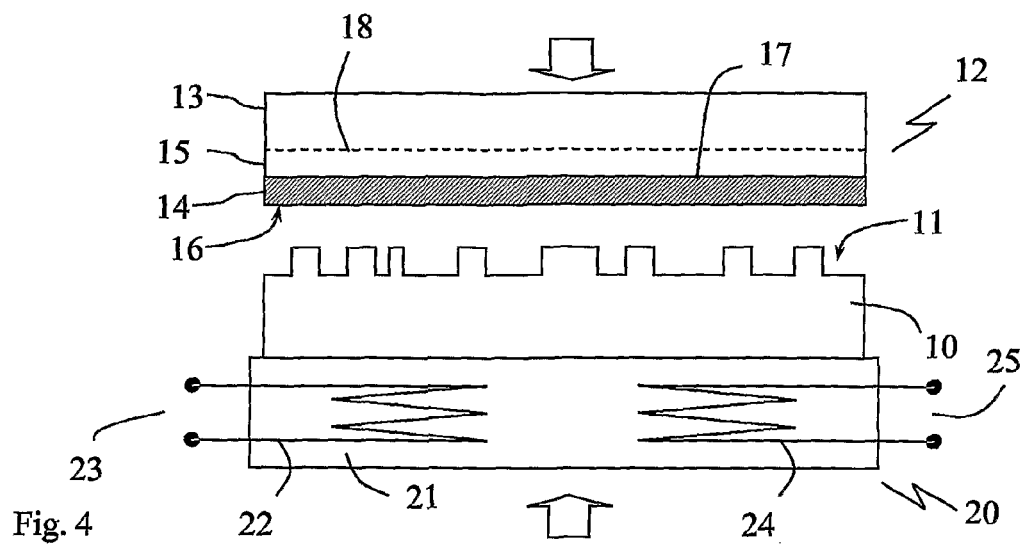
FIGS. 4-6 schematically illustrate corresponding process steps for transferring a pattern from a template to a substrate, wherein radiation is applied through a transparent substrate to solidify a polymerisable fluid on the substrate surface.
Figure 5:
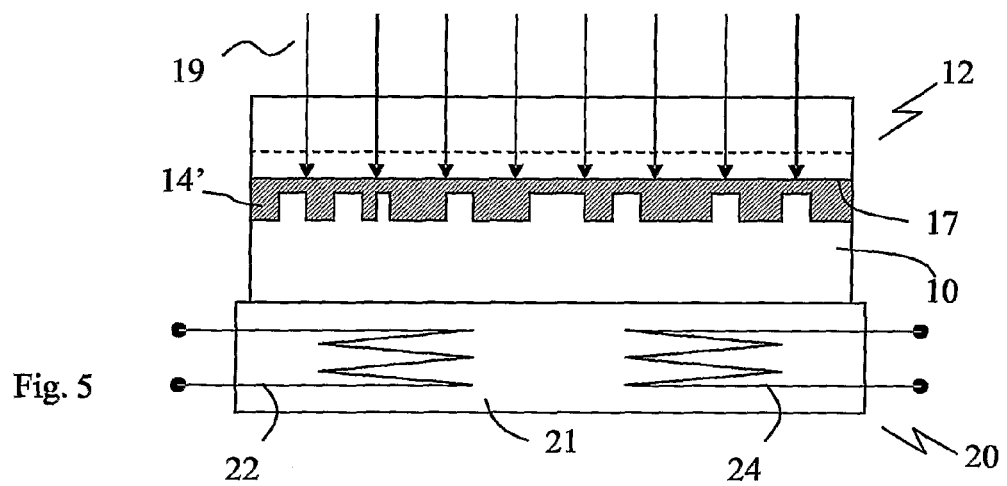
Figure 6:
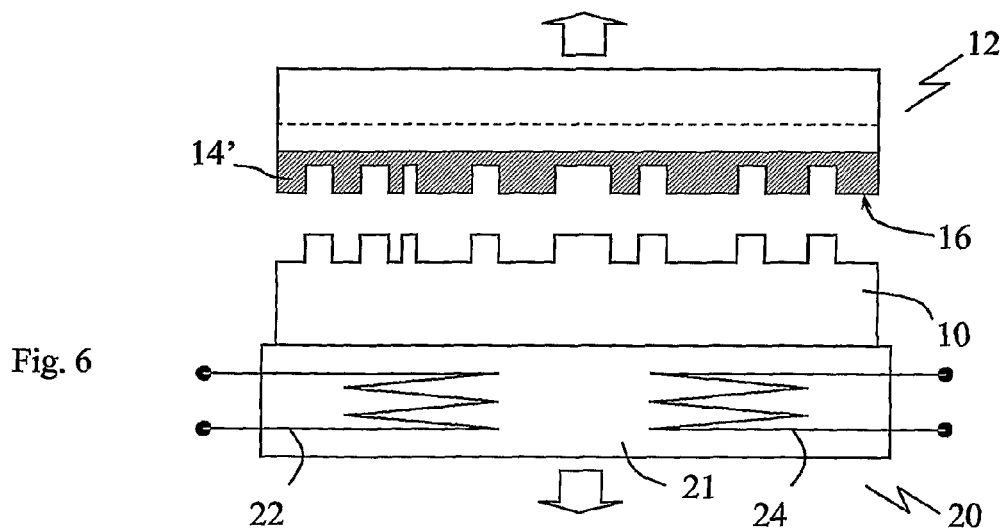

FIGS. 4-6 schematically present the basic process steps of the actual pattern transfer steps, or imprint steps, of an alternative embodiment of the invention. The only real difference from the embodiment of FIGS. 1-3 is that in this embodiment the radiation 19 is applied through substrate 12 instead of through template 10, while the same reference marks have been used. Furthermore, heater device 20 is instead connected to template 10, for heating layer 14 through template 10. In an embodiment such as the one depicted in FIGS. 4-6 an opaque template may be used, which has certain advantages. For one thing, this makes it possible to use nickel templates, which are suitable for imprint. Heater device 20 of FIGS. 4-6 otherwise comprises the same features as the heater device of FIGS. 1-3, wherefore the same reference markings have been used. No further explanation of the features of FIGS. 4-6 will therefore be made.

Figure 7:
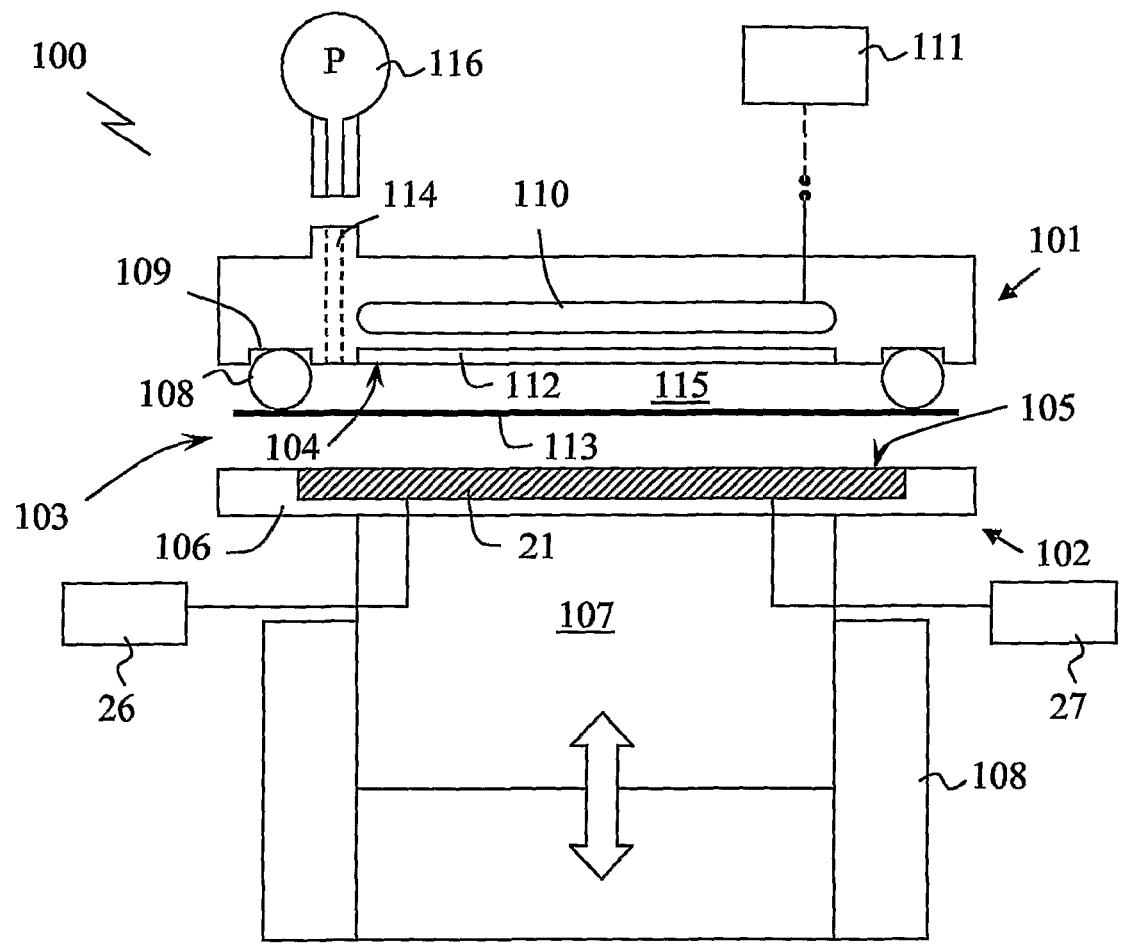
FIG. 7 schematically illustrates an embodiment of an apparatus according to the invention, for performing the process as generally described in FIGS. 1-3 or 4-6.

FIG. 7 schematically illustrates a preferred embodiment of an apparatus according to the present invention, also usable for carrying out an embodiment of the method according to the present invention. It should be noted that this drawing is purely schematic, for the purpose of clarifying the different features thereof. In particular, dimensions of the different features are not on a common scale.

The apparatus 100 comprises a first main part 101 and a second main part 102. In the illustrated preferred embodiment these main parts are arranged with the first main part 101 on top of second main part, with an adjustable spacing 103 between said main parts. When making a surface imprint by a process as illustrated in FIGS. 1-6, it may be of great importance that the template and the substrate are properly aligned in the lateral direction, typically called the X-Y plane. This is particularly important if the imprint is to be made on top of or adjacent to a previously existing pattern in the substrate. However, the specific problems of alignment, and different ways of overcoming them, are not addressed herein, but may of course be combined with the present invention when needed.

The first, upper, main part 101 has a downwards facing surface 104, and the second, lower, main part 102 has an upwards facing surface 105. Upwards facing surface 105 is, or has a portion that is, substantially flat, and which is placed on or forms part of a plate 106 which acts as a support structure for a template or a substrate to be used in an imprint process, as will be more thoroughly described in conjunction with FIGS. 8 and 9. A heater body 21 is placed on plate 106, or forms part of plate 106. Heater body 21 forms part of a heater device 20, and includes a heating element 22 and preferably also a cooling element 24, as shown in FIGS. 1-6. Heating element 22 is connected through connectors 23 to a energy source 26, e.g. an electrical power supply with current control means. Furthermore, cooling element 24 is connected through connectors 25 to a cooling source 27, e.g. a cooling fluid reservoir and pump, with control means for controlling flow and temperature of the cooling fluid.

Means for adjusting spacing 103 are, in the illustrated embodiment, provided by a piston member 107 attached at its outer end to plate 106. Piston member 107 is displaceably linked to a cylinder member 108, which preferably is held in fixed relation to first main part 101. As is indicated by the arrow in the drawing, the means for adjusting spacing 103 are devised to displace second main part 102 closer to or farther from first main part 101, by means of a movement substantially perpendicular to the substantially flat surface 105, i.e. in the Z direction. Displacement may be achieved manually, but is preferably assisted by employing either a hydraulic or pneumatic arrangement. The illustrated embodiment may be varied in a number of ways in this respect, for instance by instead attaching plate 106 to a cylinder member about a fixed piston member. It should further be noted that the displacement of second main part 102 is mainly employed for loading and unloading the apparatus 100 with a template and a substrate, and for arranging the apparatus in an initial operation position. The movement of second main part 102 is, however, preferably not included in the actual imprint process as such in the illustrated embodiment, as will be described.

First main part 101 comprises a peripheral seal member 108, which encircles surface 104. Preferably, seal member 108 is an endless seal such as an o-ring, but may alternatively be composed of several interconnected seal members which together form a continuous seal 108. Seal member 108 is disposed in a recess 109 outwardly of surface 104, and is preferably detachable from said recess. The apparatus further comprises a radiation source 110, in the illustrated embodiment disposed in the first main part 101 behind surface 104. Radiation source 110 is connectable to a radiation source driver 111, which preferably comprises or is connected to a power source (not shown). Radiation source driver 111 may be included in the apparatus 100, or be an external connectable member. A surface portion 112 of surface 104, disposed adjacent to radiation source 110, is formed in a material which is transparent to radiation of a certain wavelength or wavelength range of radiation source 110. This way, radiation emitted from radiation source 110 is transmitted towards spacing 103 between first main part 101 and second main part 102, through said surface portion 112. Surface portion 112, acting as a window, may be formed in available fused silica, quartz, or sapphire.

In operation, apparatus 100 is further provided with a flexible membrane 113, which is substantially flat and engages seal member 108. In a preferred embodiment, flexible membrane 113 is a separate member from seal member 108, and is only engaged with seal member 108 by applying a counter pressure from surface 105 of plate 106, as will be explained. However, in an alternative embodiment, membrane 113 is attached to seal member 108, e.g. by means of a cement, or by being an integral part of seal member 108. Furthermore, in such an alternative embodiment, membrane 113 may be firmly attached to main part 101, whereas seal 108 is disposed outwardly of membrane 113. For an embodiment such as the one illustrated, also membrane 113 is formed in a material which is transparent to radiation of a certain wavelength or wavelength range of radiation source 110. This way, radiation emitted from radiation source 110 is transmitted into spacing 103 through said cavity 115 and its boundary walls 104 and 113. Examples of usable materials for membrane 113, for the embodiment of FIGS. 7-9, include polycarbonate, polypropylene, polyethylene, PDMS and PEEK. The thickness of membrane 113 may typically be 10-500 μm.

A conduit 114 is formed in first main part 101 for allowing a fluid medium, either a gas, a liquid or a gel, to pass to a space defined by surface 104, seal member 108 and membrane 113, which space acts as a cavity 115 for said fluid medium. Conduit 114 is connectable to a pressure source 116, such as a pump, which may be an external or a built in part of apparatus 100. Pressure source 116 is devised to apply an adjustable pressure, in particular an overpressure, to a fluid medium contained in said cavity 115. An embodiment such as the one illustrated is suitable for use with a gaseous pressure medium. Preferably, said medium is selected from the group containing air, nitrogen, and argon. If instead a liquid medium is used, it is preferred to have the membrane attached to seal member 108. Such a liquid may be a hydraulic oil. As mentioned, another possibility is to use a gel for said medium.

Figure 8:
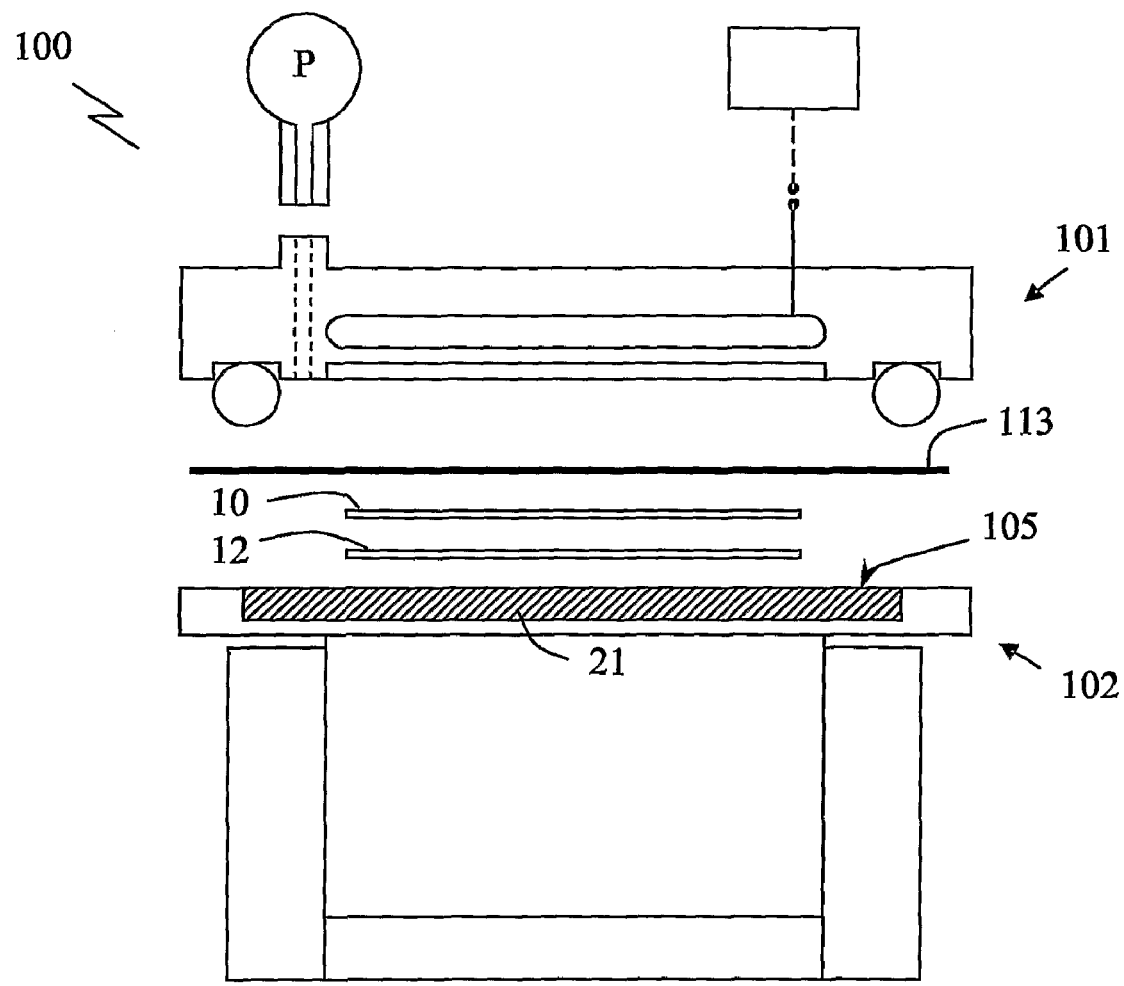
FIG. 8 schematically illustrates the apparatus of FIG. 7, when loaded with a template and a substrate at an initial step of the process.

FIG. 8 illustrates the apparatus embodiment of FIG. 7, when being loaded with a substrate and a template for a lithographic process. For better understanding of this drawing, reference is also made to FIGS. 1-3. Second main part 102 has been displaced downwards from first main part 101, for opening up spacing 103. As indicated in FIGS. 1-6, either the template or the substrate are transparent to radiation of a certain wavelength or wavelength range of radiation source 110. The illustrated embodiment of FIG. 8 shows an apparatus loaded with a transparent template 10 on top of a substrate 12. Substrate 12 is placed with a backside thereof on surface 105 of heater body 21, placed on or in the second main part 102. Thereby, substrate 12 has its substrate surface 17 with the layer 14 of a polymerisable material, e.g. a UV-crosslinkable polymer solution, facing upwards. For the sake of simplicity, all features of heater device 20, as seen in FIGS. 1-6 are not shown in FIG. 8. Template 10 is placed on or adjacent to substrate 12, with its structured surface 11 facing substrate 12. Means for aligning template 10 with substrate 12 may be provided, but are not illustrated in this schematic drawing. Membrane 113 is then placed on top of template 10. For an embodiment where membrane 113 is attached to the first main part, the step of actually placing membrane 113 on the template is, of course, dispensed with. In FIG. 8 template 10, substrate 12 and membrane 113 are shown completely separated for the sake of clarity only, whereas in a real situation they would be stacked on surface 105.

Figure 9:
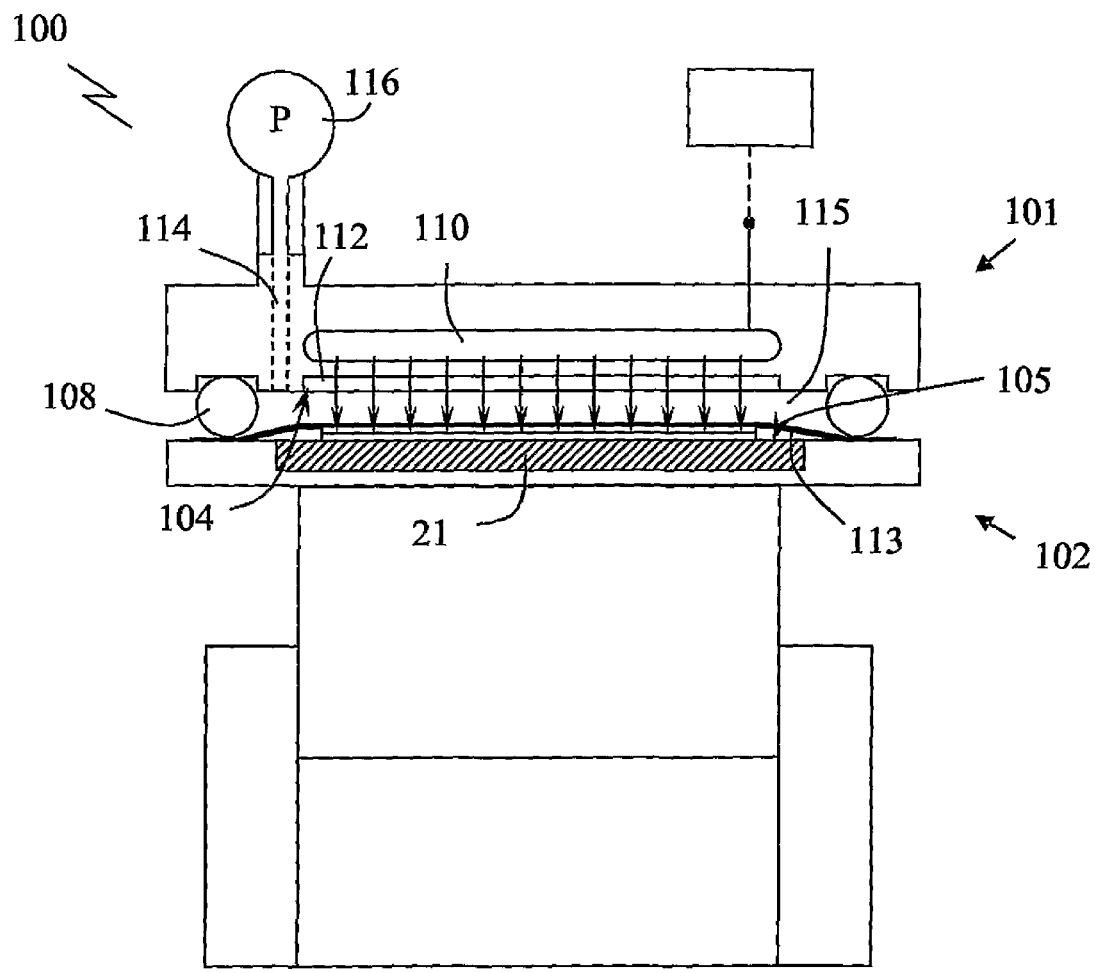
FIG. 9 illustrates the apparatus of FIGS. 7 and 8, at an active process step of transferring a pattern from the template to the substrate.

FIG. 9 illustrates an operative position of apparatus 100. Second main part 102 has been raised to a position where membrane 113 is clamped between seal member 108 and surface 105. In reality, both template 10 and substrate 12 are very thin, typically only parts of a millimetre, and the actual bending of membrane 113 as illustrated is minimal. Still, surface 105 may optionally be devised with a raised peripheral portion at the point where it contacts seal member 108 through membrane 113, for compensating for the combined thickness of template 10 and substrate 12.

Once main parts 101 and 102 are engaged to clamp membrane 113, cavity 115 is sealed. Pressure source 116 is then devised to apply an overpressure to a fluid medium in cavity 115, which may be a gas, a liquid or a gel. The pressure in cavity 115 is transferred by membrane 113 to template 10, which is pressed towards substrate 12 for imprinting the template pattern in layer 14, cf. FIG. 2. For a pre-polymer material of layer 14 having sufficient viscosity at typically room temperature, typically between 20 and 25° C., imprint may be made directly. However, crosslinkable polymer solutions typically need pre-heating to overcome its glass transition temperature $T_g$, which may be about 60° C. An example of such a polymer is the afore mr-L6000.1 XP. When using such polymers, the apparatus 100, having combined radiation and heating capabilities, is particularly useful. However, for both these types of materials a post-baking step is generally needed to harden the radiation-solidified layer 14'. As previously mentioned, an aspect of the invention is therefore to apply a raised temperature $T_p$ to the material of layer 14, which is higher than $T_g$ for the case of a crosslinkable material, and also suitable for postbaking of the radiation-exposed material. Heater device 20 is activated to heat layer 14 through substrate 12, by means of heater body 21, until $T_p$ has been reached. The actual value of $T_p$ is naturally dependent on the material chosen for layer 14. For the example of mr-L6000.1 XP, a temperature $T_p$ within the range of 50-150° C. may be used, dependent on the molecular weight distribution in the material. The pressure of the medium in cavity 115 is then increased to 5-500 bar, advantageously to 5-200 bar, and preferably to 20-100 bar. Template 10 and substrate 12 are thereby pressed together with a corresponding pressure. Thanks to flexible membrane 113, an absolutely even distribution of force is obtained over the whole of the contact surface between the substrate and the template. The template and the substrate are thereby made to arrange themselves absolutely parallel in relation to one another and, the influence of any irregularities in the surface of the substrate or template being eliminated.

When template 10 and substrate 12 have been brought together by means of the applied fluid medium pressure, radiation source is triggered to emit radiation 19. The radiation is transmitted through surface portion 112, which acts as a window, through cavity 115, membrane 113, and template 10. The radiation is partly or completely absorbed in layer 14, the material of which thereby is solidified by crosslinking or curing in the perfectly parallel arrangement between template 10 and substrate 12, provided by the pressure and membrane assisted compression. Radiation exposure time is dependent on the type and amount of material in layer 14, the radiation wavelength combined with the type of material, and of the radiation power. The feature of solidifying such a polymerisable material is well known as such, and the relevant combinations of the mentioned parameters are likewise known to the skilled person. Once the fluid has solidified to form a layer 14', further exposure has no major effect. However, after exposure the material of layer 14' is allowed to post bake, or hard bake, at the predetermined constant temperature $T_p$ for a certain time period of e.g. 1-10 minutes. For the example of mr-L6000.1 XP, postbaking is typically performed for 1-10 minutes, preferably about 3 minutes, at the common process temperature $T_p$ of 100-120° C.

With the apparatus 100 according to the present invention, post-baking is performed in the imprint machine 100, which means that it is not necessary to bring the substrate out of the apparatus and into a separate oven. This saves one process step, which makes both time and cost savings possible in the imprint process. By performing the post-baking step while the template 10 is still held at a constant temperature $T_p$, and potentially also with the selected pressure towards substrate 10, and, higher accuracy in the resulting structure pattern in layer 14 is also achieved, which makes it possible to produce finer structures. Following compression, exposure and post-baking, the pressure in cavity 115 is reduced and the two main parts 101 and 102 are separated from one another. In one embodiment, cooling element 24 of heater device 20 may be used to cool down the substrate 12 after separation of the main parts. After this, the substrate is separated from the template and subjected to further treatment according to what is previously known for imprint lithography.

FIGS. 8 and 9 illustrate a process similar to that of FIGS. 1-3. Again, it should be noted that with a transparent substrate 12, template 10 may instead be placed on surface 105 of heater body 21, with substrate on top of template 10, as shown in FIGS. 4-6.

Figure 10:
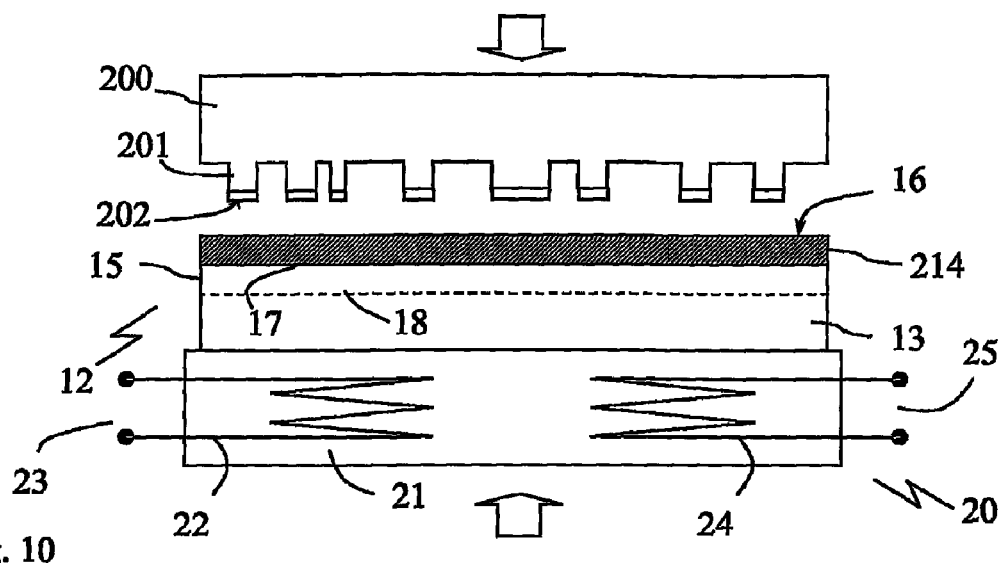
FIGS. 10-12 illustrates an alternative embodiment of an imprint process according to the present invention.
Figure 11:
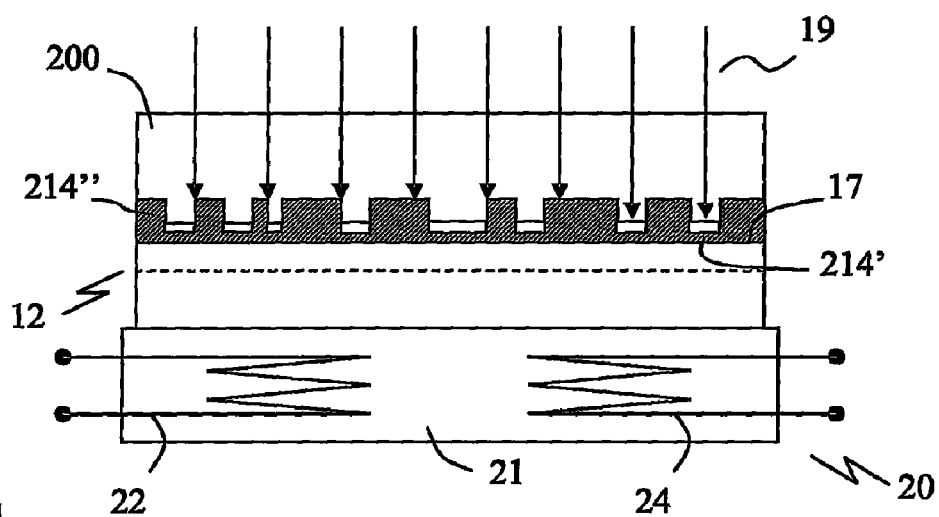
Figure 12:
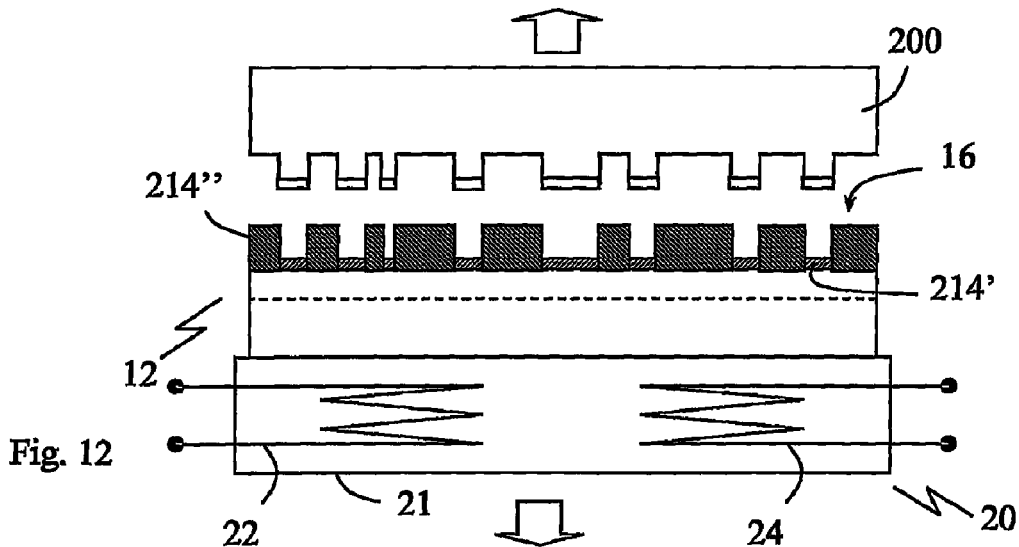

FIGS. 10-12 illustrates an alternative method of using apparatus 100, in accordance with an embodiment of the invention. The same reference markings are used for like features as in FIGS. 1-3. However, in the process of FIGS. 10-12, a transparent template 200 is used, preferably made from glass or quartz. Template 200 has a structured surface facing substrate 12, with projecting pattern-defining protrusions 201 which are non-transparent. Preferably, this is achieved by including a layer of an opaque material in the protrusions. The illustrated preferred embodiment includes opaque layers 202 covering the outer end surfaces of protrusions 201. Preferably, layers 202 are metal layers. In one embodiment, template 200 is manufactured by means of first applying a metal mask 202 on selected areas of the template surface, where after an etching process is used for defining grooves between the masked portions. Instead of removing the mask after the etching step, the mask 202 is kept on the template to define the non-transparent outer end surfaces of the template protrusions 201. By manufacturing template 200 by means of this process, it is also ensured that a near completely even common plane for the outer end surfaces of protrusions 201 is achieved, since the template manufacturing process starts from a flat template body with a plane surface. It should be noted that dimensions illustrated in FIGS. 1-12 are exaggerated for the sake of easy understanding. For instance, layers 202 may be only a few atomic monolayers thick.

In FIG. 10, template 200 is pressed into layer 214 on substrate 12, preferably by using an apparatus as described with reference to FIGS. 7-9. The material of layer 214 is in this case e.g. a UV-curable pre-polymer or a UV-crosslinkable negative resist, which may be of any known type. Heater device 20 is controlled to raise the temperature of substrate 12 to a suitable process temperature $T_p$. For the case of a crosslinkable material, heater device 20 is set to pre-heat layer 214 trough substrate 12 in order for the material of layer 214 to overcome the glass transition temperature $T_g$ and reach the elevated temperature $T_p$. An even pressure is achieved over the entire engaging surfaces of template 200 and substrate 12, thanks to the imprint technique using a membrane and gas pressure as described above. Preferably, the template 200 is pressed into layer 214 such that the outer ends of protrusions 201 come extremely close to substrate layer 17, preferably only a few nanometres.

In FIG. 11, at which template 200 has been fully pressed into layer 214, radiation 19 is applied through template 200, towards substrate 12. Radiation which hits layers 202 is stopped and reflected, and does not reach layer portions 214' positioned there under. Radiation which falls in between protrusions 201, however, will hit layer 214 and start a curing or solidification process in layer portions 214", while maintaining layer 214 at a temperature $T_p$. Preferably, a post-baking process at the same temperature $T_p$ is then performed using heater device 20 for completing the solidification process.

In the step illustrated in FIG. 12, template 200 is separated and removed from template 12, leaving layer 214 as imprinted. In this shape, substrate 12 is exposed to a negative resist developer fluid. The exact type of fluid may be of any known kind, although the skilled person realises that developer type has to be selected dependent on the resist polymer used. The developer will only remove portions 214' which were not exposed to radiation, and which remain only as very thin layers at the bottom of the recesses in the polymer layer formed by protrusions 201. Compared to prior art processes, where an ashing or etching process has to be applied to remove the remaining polymer portions 214' in the recesses, which are then also solid, this process is considerably easier and faster. Furthermore, ashing or etching of the patterned polymer layer 14 will remove material from all parts of layer 214, both portions 214' and 214", whereas the proposed method only takes away the portions 214' which were not exposed to radiation.

One embodiment of the system according to the invention further comprises mechanical clamping means, for clamping together substrate 12 and template 10. This is particularly preferred in an embodiment with an external alignment system for aligning substrate and template prior to pattern transfer, where the aligned stack comprising the template and the substrate has to be transferred into the imprint apparatus. The system may also contain means for applying a vacuum between template and substrate in order to extract air inclusions from the polymerisable layer of the stacked sandwich prior to hardening of the polymerisable material through UV irradiation.

In a preferred embodiment, the template surface 11 is preferably treated with an anti-adhesion layer to prevent the solidified polymer layer 14' from sticking to it after the imprint process. An example of such an anti-adhesion layer comprises a fluorine-containing group, as presented in WO 03/005124 and invented by one of the inventors of the instant invention. The contents of WO 03/005124 are also hereby incorporated by reference.

A first mode of the invention, with a transparent template, which has been successfully tested by the inventors, involves a substrate 12 of silicon covered by a layer 14 of NIP-K17 with a thickness of 1 µm. A template of glass or fused silica/quartz, with a thickness of 600 µm, has been used.

A second mode of the invention, with a transparent substrate, which has been successfully tested by the inventors, involves a substrate 12 of glass or fused silica/quartz covered by a layer 14 of NIP-K17 with a thickness of 1 µm. A template of e.g. nickel or silicon has been used, with a thickness of about 600 µm, though any other suitable non-transparent material can be used.

After compression by means of membrane 113 with a pressure of 5-100 bar for about 30 seconds, radiation source 110 is turned on. Radiation source 110 is typically devised to emit at least in the ultraviolet region below 400 nm. In a preferred embodiment, an air-cooled xenon lamp with an emission spectrum ranging from 200-1000 nm is employed as the radiation source 110. The preferred xenon type radiation source 110 provides a radiation of 1-10 W/cm$^2$, and is devised to flash 1-5 µs pulses, with a pulse rate of 1-5 pulses per second. A window 112 of quartz is formed in surface 104 for passing through radiation. Exposure time is preferably between 1-30 seconds, for polymerising fluid layer 14 into a solid layer 14', but may be up to 2 minutes.

Tests with mr-L6000.1 XP have been performed with about 1.8 W/cm$^2$ integrated from 200-1000 nm, with 1 minute exposure time. It should, in this context, be noted that the radiation used need not be restricted to a wavelength range within which the polymer applied in layer 14 solidifies, radiation outside that range may of course also be emitted from the radiation source used. After successful exposure and subsequent postbaking at a constant process temperature, second main part 102 is lowered to a position similar to that of FIG. 8, following which template 10 and substrate 12 are removed from the apparatus for separation and further processing of the substrate.

The present invention brings about a novel imprint method, which combines UV and thermal NIL, allowing the complete imprint sequence into UV-crosslinkable thermoplastic polymers to be performed at a constant temperature. Thereby, the method according to the invention overcomes problems related to different thermal expansions in template and substrate materials. As a result, it is possible to perform high accuracy large area imprints using different template and substrate materials. Furthermore, the method allows the use of spin-coatable UV-crosslinkable polymers with a homogeneous thickness distribution on wafer scale, which is difficult to accomplish with dispensing low viscosity UV-curable prepolymers.

The general process scheme includes three main steps; a thermal imprint sequence, followed by a UV post exposure, and a hard bake to entirely cure the polymer. In a preferred embodiment, a photo chemically amplified polymer is used, such as for example mr-L6000.1 XP.

The three steps are combined and performed at a constant temperature, giving the following process scheme. Template and substrate are heated to a temperature $T_p$, which is above $T_g$ for the case of a crosslinkable material. Preferably, this is performed by placing the template in contact with the substrate in a sandwich arrangement, and then heating either the template or the substrate by means of a heater device. This way, both the template and the substrate, and in particular the layer on the substrate which is to be imprinted, are heated to a common temperature by heat conduction. The template-substrate sandwich is then exposed to a high pressure in order to imprint the template pattern into the polymer layer. After a certain time, typically 30-60 seconds, a UV flood exposure is started in order to initiate the curing of the polymer. Before releasing the pressure the temperature is kept constant at $T_p$ to hard bake the polymer until it is entirely cured. Different template and substrate materials can easily be used to produce high accuracy large area imprints. The fact that cheap reproducible nickel templates can be used makes large area imprinting significantly more cost effective and easy to perform showing a great potential for this method.

The inventors have successfully imprinted the complete area of 2.5" glass substrates using a Blu-ray nickel template, with a line width of about 140 nm. The imprint quality shows no tendency of degradation, due to thermal effects, when moving towards the edge of the substrate. This is clearly visualized in FIGS. 13 and 14, which show AFM (Atomic Force Microscope) pictures of results obtained.

Figure 13:
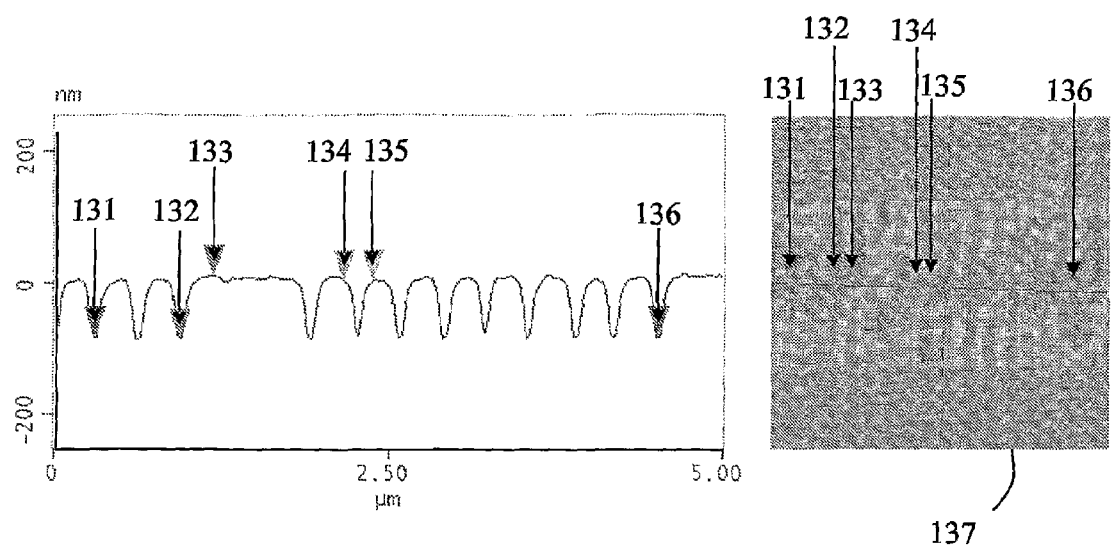
FIGS. 13-14 illustrate test results of a 2.5" substrate imprinted with a single imprint step according to the invention, with AFM pictures taken close to the centre and close to the edge of the substrate, respectively.

FIG. 13 illustrates an AFM picture 137 of an area close the centre of a Blu-ray imprint on a 2.5" glass substrate. To the left in FIG. 13, an AFM depth analysis result on the area of 137 is shown, which is measured along the horizontal line in picture 137. Selected points along that line are indicated by references 131-136, shown both in picture 137 and in the depth analysis diagram. As can be seen from the latter, the grooves formed in the imprint process according to the invention are deep and smooth.

Figure 14:
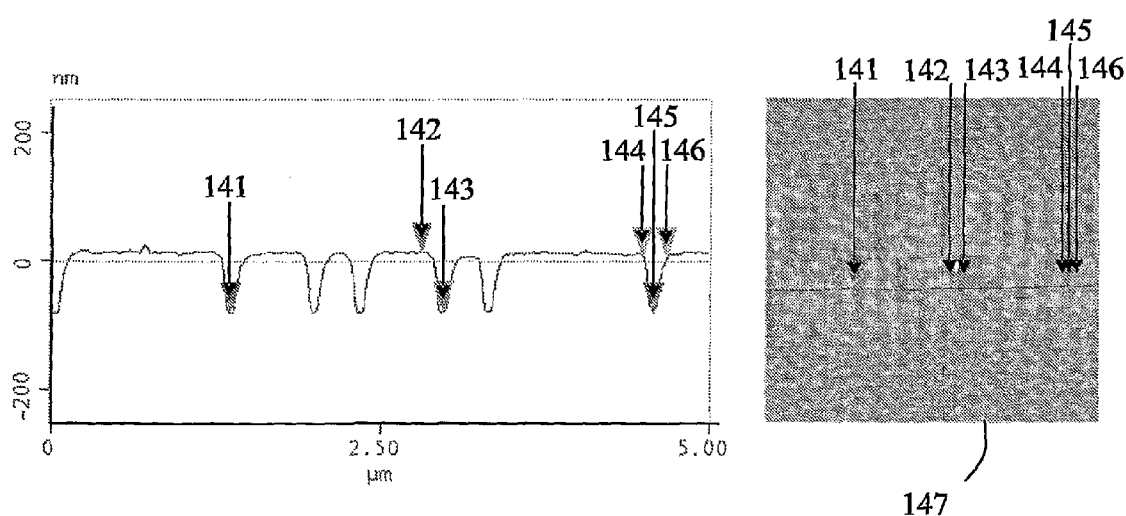

Furthermore, FIG. 14 illustrates a corresponding picture 147 of the same imprinted substrate, of an area located a few millimetres inside of the substrate edge. Similar to FIG. 13, selected points along the horizontal line in picture 147 are indicated by references 141-146, shown both in picture 147 and in the depth analysis diagram to the left of picture 147. Also in FIG. 14, it can be seen that the grooves formed in the imprint process according to the invention are deep and smooth also close to the edge of the 2.5" glass substrate, and show no tendency to unevenness or distortion due to thermal expansion.

By a single process, including three main process steps, performed in one and the same machine without having to extract the substrate from the machine in between those main steps, imprint with excellent quality is possible on large substrate surfaces. Since the entire substrate surface is imprinted in one step, the polymer layer 14 may be spin-coated onto the substrate, and continuous structures can be created over the entire substrate surface. None of this is possible with the so called step and flash method. The disclosed apparatus and method is therefore particularly advantageous for large area imprint, and has as such huge benefits over the step and flash method. By using membrane-transferred fluid pressure, the present invention can be used for one step imprint of substrates of 8 inch, 12 inch, and even larger discs. Even full flat panel displays with sizes of about 400×600 mm and larger can be patterned with a single imprint and exposure step with the present invention.

The present invention therefore provides a technique which may for the first time make radiation-assisted polymerisation imprint attractive to large scale production. The invention is usable for forming patterns in a substrate for production of e.g. printed wire boards or circuit boards, electronic circuits, miniaturised mechanical or electromechanical structures, magnetic and optical storage media etc. The embodiments described herein relate to radiation exposure of UV-crosslinkable polymers or UV-curable pre-polymers, in combination with a heater. However, from the object of providing a solution which overcomes the problem caused by thermal expansion due to having different template and substrate materials, the skilled person would realise that the present invention could equally well be implemented for a method including radiation in other wavelength ranges, to which the resist material used in the imprint layer on the substrate is responsive by solidifying during exposure. Furthermore, while the invention is particularly advantageous for imprint processes including a template and a substrate of different materials, a technical effect is obtained also when the same material is used in the template and the substrate, in that the substrate need not be removed from the imprint machine during postbaking, and the facilitated control of using a constant temperature.

By the term constant temperature is meant substantially constant, meaning that even though a temperature controller is set to maintain a certain temperature, the actual temperature obtained will inevitably fluctuate to a certain extent. The stability of the constant temperature is mainly dependent on the accuracy of the temperature controller, and inertia of the entire setup. Furthermore, it is understood that even though the method according to the invention is usable for imprinting extremely fine structures down to single nanometres, a slight temperature variation will not have a major effect as long as the template is not too large. Assuming that the structures at the periphery of the template has a width x, and a reasonable spatial tolerance is a fraction of that width, such as y=x/10, then y becomes the parameter setting the temperature tolerance. In fact, it can easily be calculated which effect differences in thermal expansion will have, by applying the respective coefficients of thermal expansion for the materials of the template and substrate, the size, typically the radius, of the template, and the spatial tolerance parameter y. From such a calculation, a suitable temperature tolerance for the temperature controller can be calculated and applied to the machine for performing the process.

The invention is defined by the appended claims.

The invention claimed is:

1. Method for transferring a pattern from a template having a structured surface to a substrate carrying a surface layer of a material devised to solidify upon exposure to radiation, comprising:
   arranging said template and substrate mutually parallel in an imprint apparatus, with said structured surface facing said surface layer;
   heating the template and the substrate to a temperature Tp suitable for postbaking the surface layer, by means of a heater device; and
while maintaining a constant temperature Tp, performing the steps of:
   pressing the template towards the substrate for imprinting said pattern into said layer;
   exposing said layer to radiation for solidifying the layer, and
   postbaking the layer for a time period of 1-10 minutes, wherein the postbaking is performed after said exposure of said layer to radiation has been completed;
and when the fluid is hardened:
   separating the template and substrate.

2. The method as recited in claim 1, wherein said material is a crosslinkable thermoplastic polymer having a glass temperature $T_g$, and wherein $T_p$ exceeds $T_g$.

3. The method as recited in claim 1, wherein said material is a UV-crosslinkable thermoplastic polymer having a glass temperature $T_g$, wherein temperature $T_p$ exceeds temperature $T_g$, and wherein said radiation is UV radiation.

4. The method as recited in claim 2 or 3, wherein said material is photo chemically amplified.

5. The method as recited in claim 1, comprising:
   applying said surface layer on the substrate by spin-coating said material, prior to the step of arranging said template and substrate mutually parallel.

6. The method as recited in claim 1, wherein said material is a UV-curable thermoplastic pre-polymer, and wherein said radiation is UV radiation.

7. The method as recited in claim 1, comprising:
   arranging the template and the substrate sandwiched between a stop member and a first side of a flexible membrane, and wherein
   the pressing of the template towards the substrate involves applying an overpressure to a medium present on a second side of the membrane.

8. The method as recited in claim 7, wherein said medium comprises a gas.

9. The method as recited in claim 7, wherein said medium comprises air.

10. The method as recited in claim 7, wherein said medium comprises a liquid.

11. The method as recited in claim 7, wherein said medium comprises a gel.

12. The method as recited in claim 1, comprising:
emitting radiation to said layer through said template, which template is transparent to a wavelength range of a radiation usable for solidifying said material; and
heating said substrate by direct contact with said heater device.

13. The method as recited in claim 1, comprising:
emitting radiation to said layer through said substrate, which substrate is transparent to a wavelength range of a radiation usable for solidifying said material; and
heating said template by direct contact with said heater device.

14. The method as recited in claim 7, comprising:
emitting radiation to said layer through said membrane, which membrane is transparent to a wavelength range of a radiation usable for solidifying said material.

15. The method as recited in claim 7, comprising:
emitting radiation to said layer through said membrane, and through a transparent wall opposing said membrane, defining a back wall for a cavity for said medium, which back wall and membrane are transparent to a wavelength range of a radiation usable for solidifying said material.

16. The method as recited in claim 1, wherein the step of exposing said layer comprises:
emitting radiation from a radiation source within a wavelength range of 100-500 nm.

17. The method as recited in claim 16, comprising:
emitting pulsating radiation with a pulse duration in the range of 0.5-10 μs and a pulse rate in the range of 1-10 pulses per second.

18. The method as recited in claim 7, comprising:
clamping said substrate and template together prior to arranging said template and substrate between said stop member and said flexible membrane.

19. The method as recited in claim 1, comprising:
applying a vacuum between said template and said substrate in order to extract air inclusions from said surface layer prior to exposing said layer to radiation.

20. The method as recited in claim 1, wherein said structured surface includes protrusions defining a pattern, which protrusions are non-transparent to said radiation, whereby the step of exposing said layer to radiation involves solidifying said layer at portions between said protrusions.

21. The method as recited in claim 20, wherein said protrusions include a layer of a non-transparent material.

22. The method as recited in claim 20, wherein a layer of a non-transparent material is applied as an outermost layer on said protrusions.

23. The method as recited in claim 1, wherein the temperature $T_p$ is within the range of 50-250° C.

* * * * *